United States Patent
Lan et al.

(10) Patent No.: US 11,809,366 B2
(45) Date of Patent: Nov. 7, 2023

(54) CONTROLLER IN HIGH-SPEED SPI MASTER MODE

(71) Applicant: Guangzhou Anyka Microelectronics Co., Ltd., Guangdong (CN)

(72) Inventors: Tiantian Lan, Guangdong (CN); Norman Shengfa Hu, Guangdong (CN)

(73) Assignee: Guangzhou Anyka Microelectronics Co., Ltd., Guangzhou (CN)

( * ) Notice: Subject to any disclaimer, the term of this patent is extended or adjusted under 35 U.S.C. 154(b) by 16 days.

(21) Appl. No.: 17/636,053

(22) PCT Filed: Mar. 1, 2020

(86) PCT No.: PCT/CN2020/077368
§ 371 (c)(1),
(2) Date: Feb. 17, 2022

(87) PCT Pub. No.: WO2021/056965
PCT Pub. Date: Apr. 1, 2021

(65) Prior Publication Data
US 2022/0342843 A1    Oct. 27, 2022

(30) Foreign Application Priority Data

Sep. 27, 2019   (CN) .......................... 201910924892.7

(51) Int. Cl.
*G06F 13/42* (2006.01)
*G06F 13/16* (2006.01)
(Continued)

(52) U.S. Cl.
CPC ...... *G06F 13/4291* (2013.01); *G06F 13/1689* (2013.01); *G06F 13/30* (2013.01); *H03L 7/0992* (2013.01)

(58) Field of Classification Search
CPC .. G06F 13/4291; G06F 13/1689; G06F 13/30; H03L 7/0992; Y02D 10/00
See application file for complete search history.

(56) References Cited

U.S. PATENT DOCUMENTS

| | | | |
|---|---|---|---|
| 2004/0193936 A1* | 9/2004 | Kelly | G06F 5/06 713/500 |
| 2011/0072297 A1* | 3/2011 | Huang | G06F 13/4282 710/110 |
| 2018/0151232 A1* | 5/2018 | Chang | G11C 16/32 |

FOREIGN PATENT DOCUMENTS

CN           101382927 B       6/2010

* cited by examiner

*Primary Examiner* — Glenn A. Auve

(57) ABSTRACT

In view of defects in the prior art, the present disclosure provides a controller in a high-speed serial peripheral interface (SPI) master mode, where clock signals are provided by a phase locked loop (PLL), and the entire controller includes: a low-speed clock domain and a high-speed clock domain, where the PLL provides two main clock signals by different clock frequency dividers, provides a low-speed clock signal to the low-speed clock domain, and provides a high-speed source clock signal to the high-speed clock domain. By such technical solutions in the present disclosure, functions of different clock domains are divided through asynchronization of a high-speed SPI controller, and the function of a high-speed SPI flash access is implemented, thereby saving a read/write time. Especially in an application scenario of an SPI flash boot, the controller can greatly optimize a startup time.

12 Claims, 4 Drawing Sheets

(51) Int. Cl.
*G06F 13/30* (2006.01)
*H03L 7/099* (2006.01)

CONTROLLER IN HIGH-SPEED SPI MASTER MODE

TECHNICAL FIELD

The present disclosure relates to the technical field of electronic circuits, and in particular, to a controller in a high-speed serial peripheral interface (SPI) master mode.

BACKGROUND

An SPI is a synchronous serial interface technology launched by Motorola, and is mainly used among an electrically erasable programmable read-only memory (EEPROM), a flash, a real-time clock (RTC), an analog to digital converter (ADC), a digital signal processor (DSP), and a digital signal decoder. Generally, a maximum clock frequency of the SPI is ½ of a system clock frequency, and a transmission rate of the SPI is mainly limited by a capability of a central processing unit (CPU) processing SPI data. However, the maximum clock frequency may restrict the transmission rate. Because a higher clock indicates a faster read/write speed, when the clock frequency increases, a controller also needs to work at a higher clock frequency, which causes excessive high power consumption and area costs of an entire chip, and increases a difficulty in designing a high-speed IO interface.

Therefore, another manner is adopted for accelerating the transmission rate. For example, the invention patent "HIGH-SPEED SPI CIRCUIT INTEGRATED IN CHIP" with the authorized publication No. CN101382927B is disclosed. The high-speed SPI circuit has an acceleration working mode, in which the CPU notifies a length of a data access address during data transmission, an acceleration control unit controls read/write, and when an acceleration operation is completed, an advanced high-performance bus (AHB) master interface unit sends an interrupt, to reduce the occupation of CPU resources. This is adapted to high-speed transmission of a large amount of complex data, and increases data throughput.

In such a solution, the efficiency of data transmission is mainly improved by optimizing data, but there is no obvious improvement on a transmission rate of a low-frequency clock domain.

SUMMARY

The present disclosure relates to a controller in a high-speed SPI master mode. Through structural improvement, an SPI controller can still increase a working frequency of an SPI when working in a low-frequency clock domain, to reach a limit of a speed that an SPI flash device can support.

To resolve at least of the foregoing technical problems, the present disclosure is implemented by the following technical solutions.

A controller in an SPI master mode is provided, where clock signals are provided by a phase locked loop (PLL), and the entire controller includes:

a low-speed clock domain, including a direct memory access (DMA) control interface, used for direct storing/retrieving data of receiving and sending of the controller in a memory, and implementing conversion of a DMA bus protocol; and a high-speed clock domain, where the high-speed clock domain includes:

a software interaction interface, configured to control a central processing unit (CPU) to read/write a controller and a status register;

an interface clock generation unit, configured to generate an SPI clock signal after frequency division;

a data readback calibration unit, configured to receive data transmitted from an SPI flash;

a receiving control unit and a sending control unit, configured for receiving and sending data signals of the SPI flash; and a pin delay control unit, configured to implement timing control of high-speed input/output (TO) of an SPI, where the PLL provides two main clock signals by different clock frequency dividers, provides a low-speed clock signal to the low-speed clock domain, and provides a high-speed source clock signal to the high-speed clock domain.

Preferably, the interface clock generation unit provides a clock signal to the pin delay control unit, the pin delay control unit is connected to the data readback calibration unit and provides a compensation clock to the data readback calibration unit, and the data readback calibration unit is connected to the receiving control unit.

Preferably, a frequency of the high-speed source clock signal is fixed to an integer multiple of a frequency of the SPI clock signal.

Further, the frequency of the high-speed source clock signal is fixed to 2 times the frequency of the SPI clock signal, and in this case, the interface clock generation unit generates an SPI clock after divide-by-2 frequency division.

Preferably, the low-speed clock domain and the high-speed clock domain are isolated by data buffer units, and the data buffer units configured to perform isolation are a data receiving buffer unit and a data sending buffer unit.

Preferably, both the data receiving buffer unit and the data sending buffer unit are asynchronous first in first out (FIFO) data buffer units.

Preferably, the data readback calibration unit includes two stages of registers connected to each other, an output terminal of a first stage register is connected to an input terminal of a second stage register, and an output terminal of the second stage register is connected to a shift register; and a clock signal of the first stage register comes from a compensation clock signal, and clock signals of the second stage register and the shift register both come from the high-speed source clock signal.

Preferably, the second stage register latches output data of the first stage register by directly using a falling edge of the high-speed source clock signal, and an output of the second stage register is then latched to the shift register on a rising edge of the high-speed source clock signal through a combined logic path.

Preferably, the pin delay control unit is provided with a compensation circuit configured to compensate for a delay of an SPI CLOCK signal for sampling and receiving a data clock and a pin inside an SPI controller.

Preferably, the software interaction interface supports selection of interface modes: a Dual SPI, a Quad SPI, or a standard SPI.

By such technical solutions in the present disclosure, functions of different clock domains are divided through asynchronization of a high-speed SPI controller; and the high-speed source clock is set to be fixed to an integer multiple of the interface clock, and the high-speed source clock is used in a high-speed logic part of the controller, to increase a transmission rate. The designing the data readback calibration unit includes: latching SPI flash read data from the pin by a falling edge of a compensated receive clock; isolating and optimizing, by the two stages of registers, a timing path; and compensating for functions of the circuit by a constraint of the pin delay control unit, to reduce the delay as much as possible. In summary, the function of a high-speed SPI flash access is implemented, thereby saving a read/write time. Especially in an application scenario of an SPI flash boot, the controller can greatly optimize a startup time.

BRIEF DESCRIPTION OF THE DRAWINGS

The accompanying drawings show exemplary implementations of the present disclosure, and are used for explaining the principles of the present disclosure together with the description thereof. The accompanying drawings are included to provide a further understanding of the present disclosure, and are included in and constitute part of the specification.

A delay 1 in the figure is a path delay difference between a clock at an SPI flash pin and a clock at which a sampling clock is received inside an SPI controller.

A delay 2 is a read data delay of an external SPI flash.

A delay 3 is a delay of a data line of a flash inside a chip.

DETAILED DESCRIPTION

The present disclosure is further described in detail below with reference to the accompanying drawings and implementations. It should be understood that specific implementations described herein are merely intended to explain related content, and are not intended to limit the present disclosure. In addition, it should be further noted that for convenience of description, only parts related to the present disclosure are shown in the accompanying drawings.

It should be noted that the implementations in the present disclosure and features in the implementations may be combined with each other if no conflict occurs. The present disclosure is described in detail below with reference to the accompanying drawings and in combination with the implementations.

Figure 1:
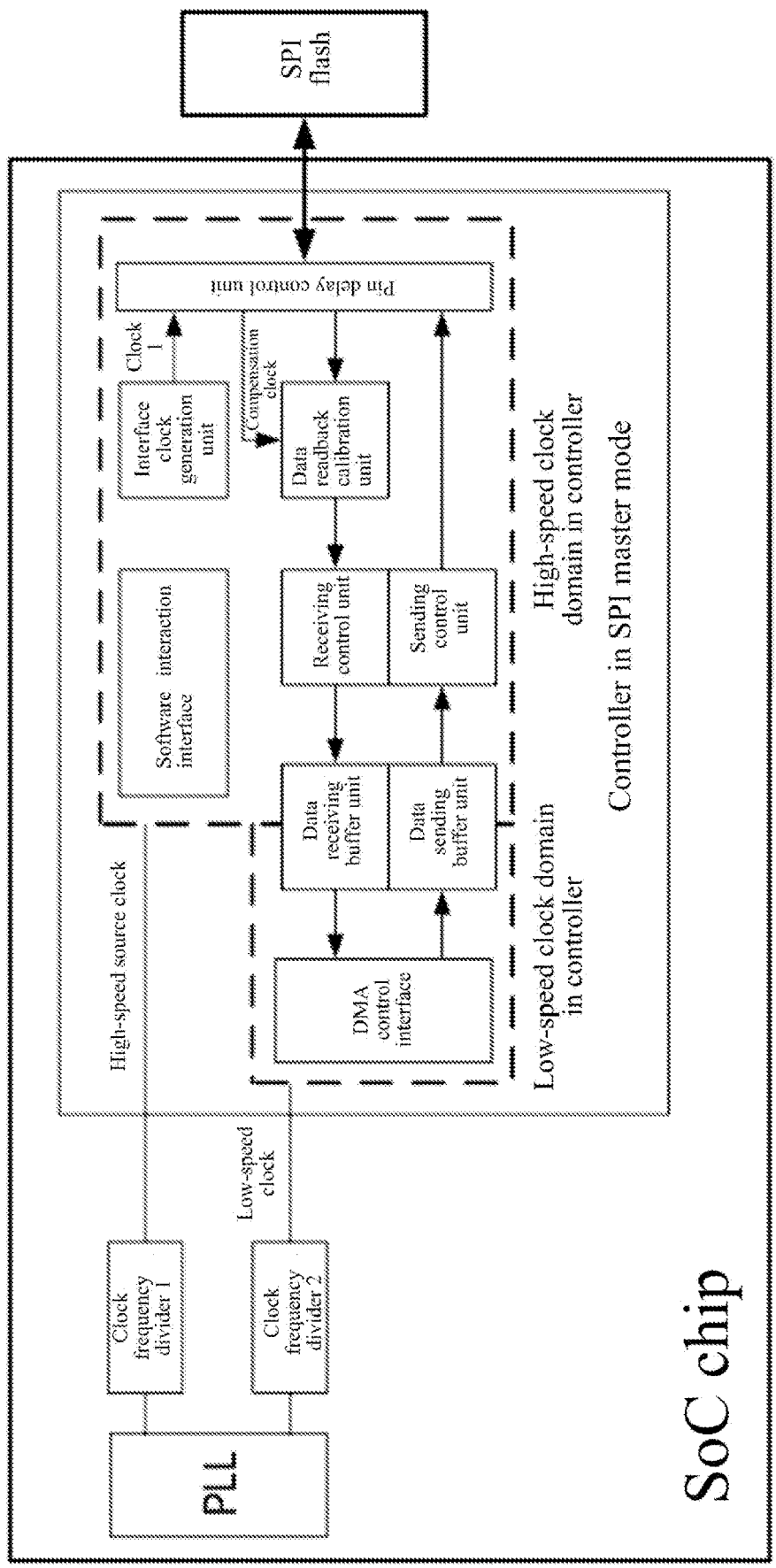
FIG. 1 is a schematic structural diagram of a system on chip (SoC) chip in which a controller in a high-speed serial peripheral interface (SPI) master mode is located according to the present disclosure.

As shown in FIG. 1, a controller in a high-speed serial peripheral interface (SPI) master mode is provided in the present disclosure, where clock signals are provided by a phase locked loop (PLL), and the entire controller includes: a low-speed clock domain, including a direct memory access (DMA) control interface, used for direct storing/retrieving data of receiving and sending of the controller in a memory, and implementing conversion of a DMA bus protocol; a high-speed clock domain, including: a software interaction interface, configured to control a central processing unit (CPU) to read/write a controller and a status register; an interface clock generation unit, configured to generate an SPI clock signal after frequency division; a data readback calibration unit, configured to receive data transmitted from an SPI flash; a receiving control unit and a sending control unit, configured for receiving and sending data signals of the SPI flash; and a pin delay control unit, configured to implement timing control of high-speed input/output (TO) of an SPI, where the PLL provides two main clock signals by different clock frequency dividers, provides a low-speed clock signal to the low-speed clock domain, and provides a high-speed source clock signal to the high-speed clock domain. In the present disclosure, the PLL needs to provide two master clocks, where a low-speed clock may be used for a data interaction part of the controller, and a high-speed clock is used for implementation of an SPI protocol and the receiving and sending of data of an external SPI flash. Through such division of the clock domains, most of the controller may work in a low-frequency clock domain, and only a part of the SPI is in a high-frequency circuit, thereby effectively increasing a transmission rate while ensuring stability.

The interface clock generation unit provides a clock signal to the pin delay control unit, the pin delay control unit is connected to the data readback calibration unit and provides a compensation clock to the data readback calibration unit, and the data readback calibration unit is connected to the receiving control unit. A frequency of the high-speed source clock signal is fixed to an integer multiple of a frequency of the SPI clock signal.

Figure 2:
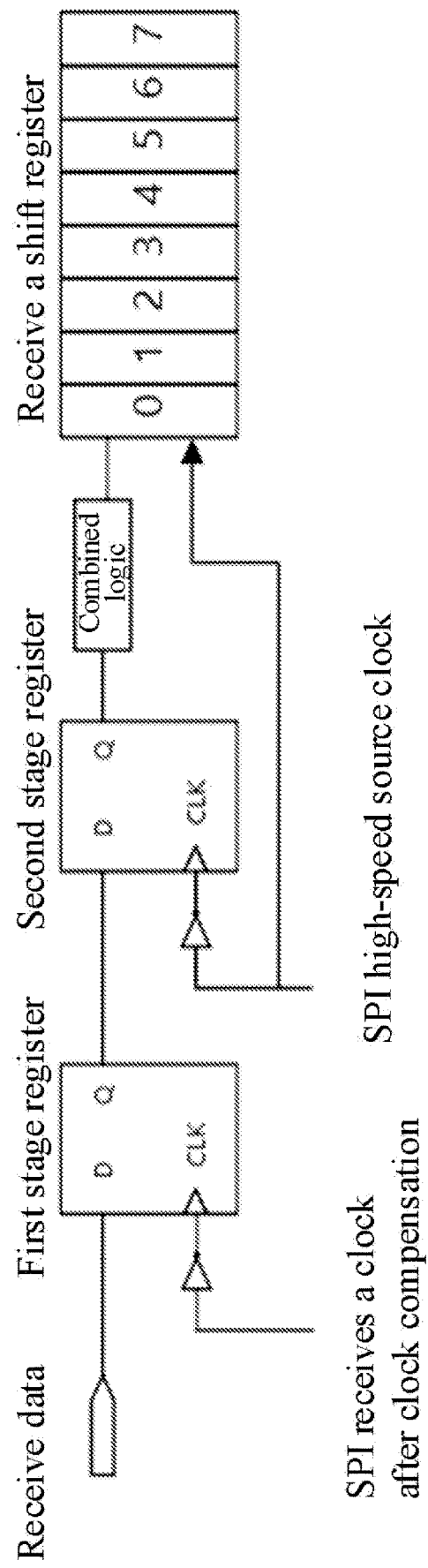
FIG. 2 is a schematic structural diagram of a data readback calibration unit in a controller in a high-speed SPI master mode according to the present invention.

In this embodiment, the frequency of the high-speed source clock signal is fixed to 2 times the frequency of the SPI clock signal, and in this case, the interface clock generation unit generates an SPI clock after divide-by-2 frequency division. The 2 times frequency facilitates later control, and it is likely to reduce errors during later work, so that it is the most reliable in use. The low-speed clock domain and the high-speed clock domain are isolated by data buffer units, and the data buffer units configured to perform isolation are a data receiving buffer unit and a data sending buffer unit. Both the data receiving buffer unit and the data sending buffer unit are asynchronous first in first out (FIFO) data buffer units. As shown in FIG. 2, the data readback calibration unit includes two stages of registers connected to each other, an output terminal of a first stage register is connected to an input terminal of a second stage register, and an output terminal of the second stage register is connected to a shift register; and a clock signal of the first stage register comes from a compensation clock signal, and clock signals of the second stage register and the shift register both come from the high-speed source clock signal. The second stage register latches output data of the first stage register by directly using a falling edge of the high-speed source clock signal, and an output of the second stage register is then latched to the shift register on a rising edge of the high-speed source clock signal through a combined logic path. The pin delay control unit is provided with a compensation circuit configured to compensate for a delay of an SPI clock signal for sampling and receiving a data clock and a pin inside an SPI controller. The compensation circuit is a common delay circuit in the prior art, but needs to be tested after being set, to ensure the accuracy of delay compensation.

The software interaction interface supports selection of interface modes: a Dual SPI, a Quad SPI, or a standard SPI. The Qual SPI may receive and send 4 bits of data in one clock cycle, which achieves highest efficiency; the Dual SPI may receive and send 2 bits of data in one clock cycle; and the standard SPI may receive and send only 1 bit of data in one clock cycle. The SPI protocol is based on the sending and receiving of bytes. There is a bit counter and a shift register inside the sending control unit, values of the bit counter are automatically added in each SPI clock cycle, and the shift register performs a shift operation, and maps to-be-sent data to a data line of an SPI. When the value of the bit counter is 8, it indicates that one byte has been sent. In this case, if a next byte needs to continue to be sent, data of the next byte is read immediately from a buffer area, to implement consecutive sending.

Such a setting meets different concerns of on-site implementation, and for on-site use focusing on efficiency, users select to use the Quad SPI. For a usage scenario in which a quantity of pins is minimized, it is more appropriate to select the standard SPI.

Figure 3:
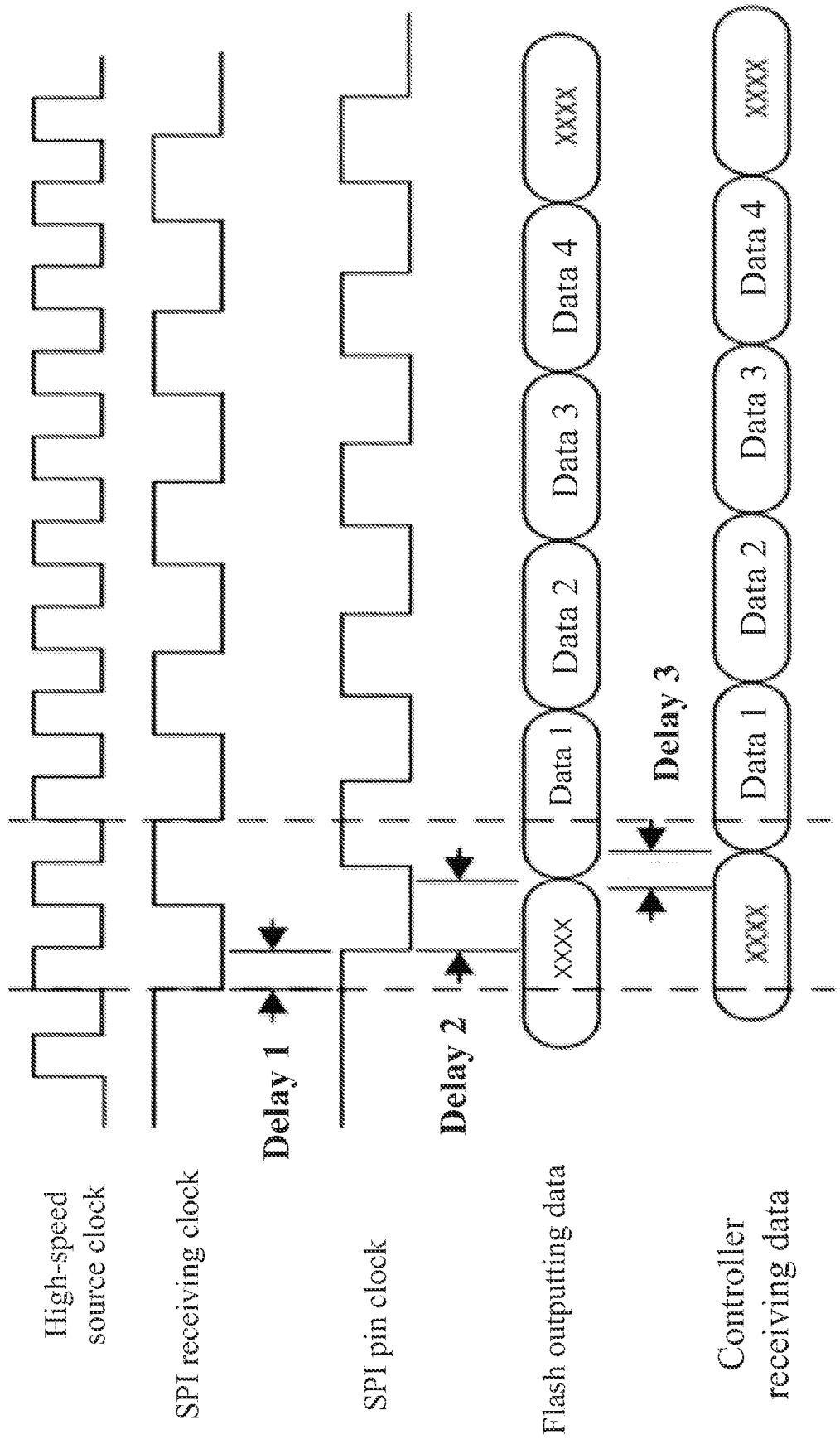
FIG. 3 is a timing diagram of conventional SPI flash read/write.

FIG. 3 is a timing diagram of conventional SPI flash read/write. As shown in the figure, the most stressful timing case in SPI flash read/write is mainly a read operation. For a write operation, all signals of an SPI flash come from an SPI controller, and provided that offsets of clocks outputted by the controller and timing paths of write data are basically the same, a high-speed write operation can be ensured. A difficulty lies in convergence work of a timing path of the read operation. The problems that cannot be resolved in the prior art are as follows:

1. There is a path delay difference between a clock at an SPI flash pin and a clock at which a sampling clock is received inside an SPI controller, that is, a delay 1 in FIG. 3. A main reason for this difference is a delay during which a clock output passes through a PAD pin and a path delay of a clock signal from an interface clock generation unit to the PAD pin.
2. A read data delay of an external SPI flash is a delay 2 in FIG. 3. The delay is generally relatively long, and to a great extent determines a fastest speed at which the flash can run.
3. A delay of a data line of a flash inside a chip is a delay 3 in FIG. 3. A main reason for this difference is a delay during which a data line input passes through the PAD pin and a path delay from the PAD pin to a sampling register in a data readback calibration unit.

For an SPI flash controller, a total duration of the delay 1, the delay 2, and the delay 3 determines a highest speed that can be supported. A shorter delay 1 and a shorter delay 3 indicate a higher speed at which the SPI controller can run. Therefore, the following technical solutions are used in the present disclosure.

Figure 4:
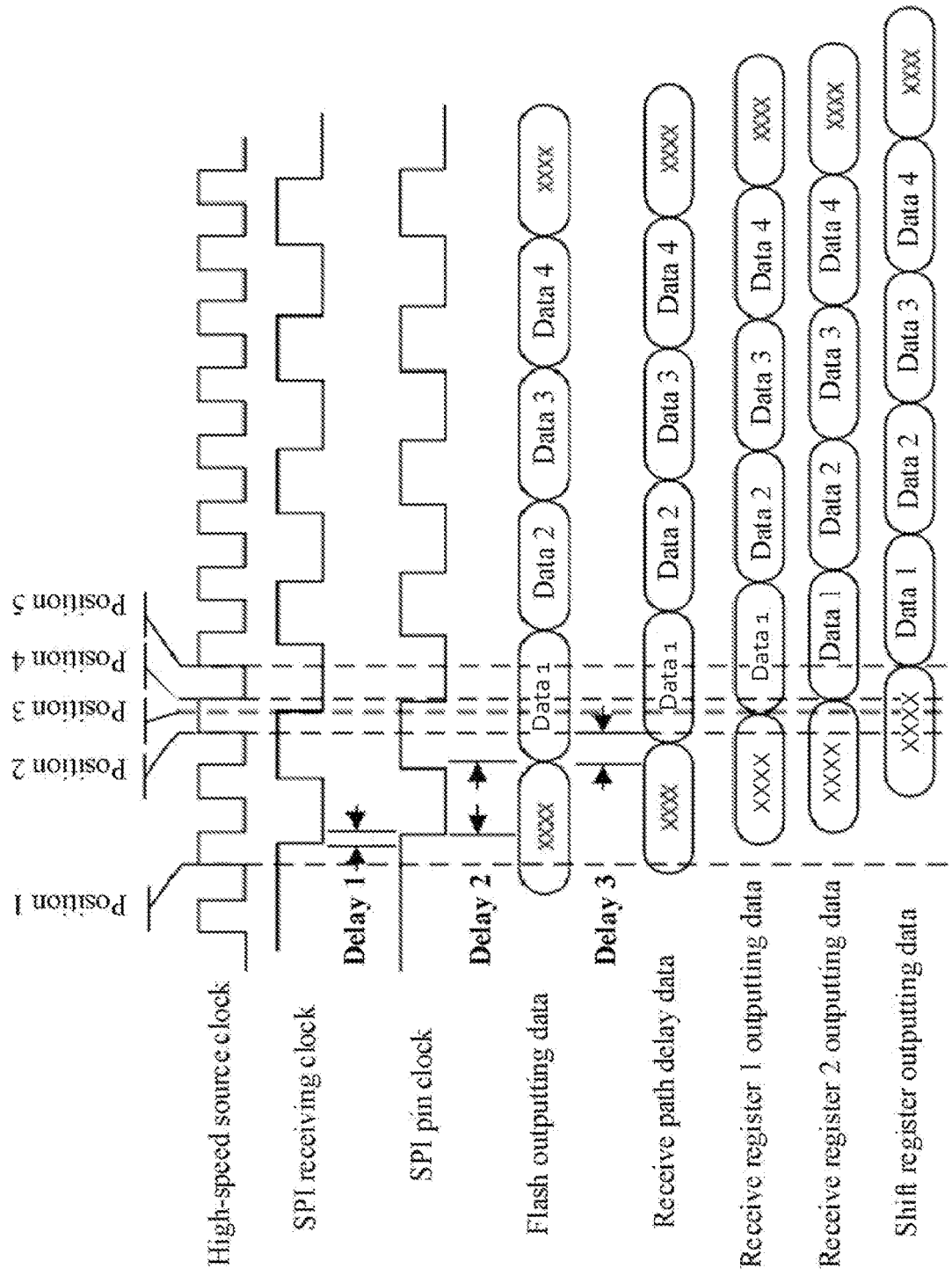
FIG. 4 is a timing diagram of a receiving circuit of a controller in a high-speed SPI master mode according to the present disclosure.

As shown in FIG. 4, first, a frequency of a high-speed source clock is fixed to 2 times a frequency of an SPI clock. This frequency relationship allows the controller to support different interface timing modes and detection of an edge of an SPI flash clock, and to notify, through determination of the edge, a receiving control unit and a sending control unit for receiving and sending data signals of an SPI flash. That is, synchronous design is used in data receiving and sending and an SPI protocol implementation part. The interface clock generation unit is configured to generate an SPI clock after divide-by-2 frequency division. The clock can only be reversed during a data valid period, to implement clock signals with a plurality of timing relationships in the SPI protocol. A 2 times relationship is an optimal ratio for implementing an architecture and has both a high-speed SPI and a simple synchronization design solution.

Second, the pin delay control unit is configured for strict control of high-speed IO timing of an SPI. To ensure that a wiring delay of an IO output path is as short as possible, this wiring needs to be adjusted according to an actual circuit. The delay 1 is shortened. In addition, it is required that wiring offsets between output paths are basically the same, to ensure a correct write operation. To ensure that a delay of an input path is as short as possible, the delay 3 is shortened. A compensation circuit is designed for compensating for a delay of an SPI clock signal for sampling and receiving a data clock and a pin inside an SPI controller. The compensation circuit makes, for the delay 1 by a delay unit, an edge of an internal receiving clock aligned with an SPI clock as much as possible. To control a wiring delay of an IO input path as short as possible, the delay 3 is shortened. The entire pin delay control unit is a back-end implementation solution, and has a relatively large association with a process and a back-end layout wiring. In general, a principle that the SPI controller is as close as possible to a chip pin and an IO input/output delay is as short as possible is followed.

By the technical solutions provided in the present disclosure, under a 40 nm process of a common system on chip (SoC) chip, the SPI controller may stably read/write an SPI flash at an interface speed of 120 MHz, and the speed is already a highest speed that a mainstream SPI flash can reach. In addition, the use stability and service life can be ensured.

In the description of this specification, the description of the reference terms "one embodiment/implementation", "some embodiments/implementations", "example", "specific example" or "some examples" means that the specific features, structures, materials or characteristics described with reference to the embodiment/implementation or example are included in at least one embodiment/implementation or example of this application. In this specification, the illustrative expressions of the foregoing terms are not intended to refer to the same embodiment/implementation or example. Moreover, the particular features, structures, materials or characteristics described may be combined in any suitable manner in any one or more embodiments/implementations or examples. In addition, those skilled in the art may combine different embodiments/implementations described herein or examples or features in different embodiments/implementations or examples without any contradiction.

Moreover, the terms such as "first" and "second" are used only for the purpose of description and cannot be understood as indicating or implying a relative importance, or implicitly indicating a quantity of indicated technical features. Therefore, features defined by "first" and "second" may explicitly or implicitly include at least one of the features. In the description of the present disclosure, "a plurality of" refers to at least two, for example, two or three, unless otherwise clearly and specifically limited.

A person skilled in the art should understand that the foregoing implementations are merely intended to describe the present disclosure clearly, and are not intended to limit the scope of the present disclosure. A person skilled in the art may further make other changes or variations based on the foregoing disclosure, but these changes or variations still fall within the scope of the present disclosure.

The invention claimed is:

1. A controller in a high-speed serial peripheral interface (SPI) master mode, wherein clock signals are provided by a phase locked loop (PLL), and the controller comprises:
   a low-speed clock domain, comprising a direct memory access (DMA) control interface, used for data interaction between the controller and a memory, and implementing conversion of a DMA bus protocol; and
   a high-speed clock domain, wherein
   the high-speed clock domain comprises:

a software interaction interface, configured to control a central processing unit (CPU) to read/write a controller and a status register;
an interface clock generation unit, configured to generate an SPI clock signal after frequency division;
a data readback calibration unit, configured to receive data transmitted from an SPI flash;
a receiving control unit and a sending control unit, configured for receiving and sending data signals of the SPI flash; and
a pin delay control unit, configured to implement timing control of high-speed input/output (IO) of an SPI, wherein
the PLL provides two main clock signals by different clock frequency dividers, provides a low-speed clock signal to the low-speed clock domain, and provides a high-speed source clock signal to the high-speed clock domain.

2. The controller in a high-speed SPI master mode according to claim 1, wherein the interface clock generation unit provides a clock signal to the pin delay control unit, the pin delay control unit is connected to the data readback calibration unit and provides a compensation clock to the data readback calibration unit, and the data readback calibration unit is connected to the receiving control unit.

3. The controller in a high-speed SPI master mode according to claim 2, wherein a frequency of the high-speed source clock signal is fixed to an integer multiple of a frequency of the SPI clock signal.

4. The controller in a high-speed SPI master mode according to claim 3, wherein the frequency of the high-speed source clock signal is fixed to 2 times the frequency of the SPI clock signal, and in this case, the interface clock generation unit generates an SPI clock after divide-by-2 frequency division.

5. The controller in a high-speed SPI master mode according to claim 1, wherein a frequency of the high-speed source clock signal is fixed to an integer multiple of a frequency of the SPI clock signal.

6. The controller in a high-speed SPI master mode according to claim 5, wherein the frequency of the high-speed source clock signal is fixed to 2 times the frequency of the SPI clock signal, and in this case, the interface clock generation unit generates an SPI clock after divide-by-2 frequency division.

7. The controller in a high-speed SPI master mode according to claim 1, wherein the low-speed clock domain and the high-speed clock domain are isolated by data buffer units, and the data buffer units configured to perform isolation are a data receiving buffer unit and a data sending buffer unit.

8. The controller in a high-speed SPI master mode according to claim 7, wherein both the data receiving buffer unit and the data sending buffer unit are asynchronous first in first out (FIFO) data buffer units.

9. The controller in a high-speed SPI master mode according to claim 1, wherein the data readback calibration unit comprises two stages of registers connected to each other, an output terminal of a first stage register is connected to an input terminal of a second stage register, and an output terminal of the second stage register is connected to a shift register; and a clock signal of the first stage register comes from a compensation clock signal, and clock signals of the second stage register and the shift register both come from the high-speed source clock signal.

10. The controller in a high-speed SPI master mode according to claim 9, wherein the second stage register latches output data of the first stage register by directly using a falling edge of the high-speed source clock signal, and an output of the second stage register is then latched to the shift register on a rising edge of the high-speed source clock signal through a combined logic path.

11. The controller in a high-speed SPI master mode according to claim 1, wherein the pin delay control unit is provided with a compensation circuit configured to compensate for a delay of an SPI clock signal for sampling and receiving a data clock and a pin inside an SPI controller.

12. The controller in a high-speed SPI master mode according to claim 1, wherein the software interaction interface supports selection of interface modes: a Dual SPI, a Quad SPI, or a standard SPI.

* * * * *